United States Patent
Fukayama et al.

(10) Patent No.: US 10,217,676 B2
(45) Date of Patent: Feb. 26, 2019

(54) METHOD AND APPARATUS FOR MANUFACTURING A SEMICONDUCTOR DEVICE INCLUDING A PLURALITY OF SEMICONDUCTOR CHIPS CONNECTED WITH BUMPS

(71) Applicant: Toshiba Memory Corporation, Tokyo (JP)

(72) Inventors: Shinya Fukayama, Nagoya Aichi (JP); Naoyuki Komuta, Oita Oita (JP); Hiroshi Watabe, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/233,914

(22) Filed: Aug. 10, 2016

(65) Prior Publication Data

US 2017/0069551 A1    Mar. 9, 2017

(30) Foreign Application Priority Data

Sep. 9, 2015    (JP) .................................. 2015-177482

(51) Int. Cl.
*H01L 25/00*    (2006.01)
*H01L 21/66*    (2006.01)
*H01L 23/00*    (2006.01)

(52) U.S. Cl.
CPC .............. *H01L 22/12* (2013.01); *H01L 22/20* (2013.01); *H01L 24/81* (2013.01); *H01L 25/50* (2013.01); *H01L 2224/81908* (2013.01); *H01L 2225/06513* (2013.01)

(58) Field of Classification Search
CPC ......... H01L 22/12; H01L 25/50; H01L 22/20; H01L 24/81; H01L 2224/81908;
(Continued)

(56) References Cited

U.S. PATENT DOCUMENTS 9,052,187 B2    6/2015  Komuta et al.
2004/0178907 A1*  9/2004  Cordoba .......... G08B 13/1427
                                    340/539.21
(Continued)

FOREIGN PATENT DOCUMENTS

CN    101436560 A    5/2009
JP    2001110821 A   4/2001
(Continued)

OTHER PUBLICATIONS

Taiwan Office Action dated Apr. 25, 2017, filed in Taiwan counterpart Application No. 105106352, 6 pages (with translation).
(Continued)

*Primary Examiner* — Selim Ahmed
(74) *Attorney, Agent, or Firm* — Kim & Stewart LLP

(57) ABSTRACT

A method for manufacturing a semiconductor device including a plurality of semiconductor chips includes steps of placing, on a first semiconductor chip, a second semiconductor chip, such that a plurality of bumps is located between the first semiconductor chip and the second semiconductor chip, determining a distance between the first semiconductor chip and the second semiconductor chip, and determining whether or not the distance is within a predetermined range and stopping placement of additional chips if the distance is determined to be outside the predetermined range.

9 Claims, 10 Drawing Sheets

(58) Field of Classification Search
CPC ......... H01L 2225/06513; H01L 25/043; H01L 25/0657; H01L 25/074; H01L 25/0756; H01L 25/117
See application file for complete search history.

(56) References Cited

U.S. PATENT DOCUMENTS

2008/0127486 A1* 6/2008 Hirata ............... H01L 21/67144
 29/832
2009/0127315 A1 5/2009 Okita

FOREIGN PATENT DOCUMENTS

| | | |
|---|---|---|
| JP | 2006073814 A | 3/2006 |
| JP | 2009124047 A | 6/2009 |
| JP | 2010245307 A | 10/2010 |
| JP | 2013197412 A | 9/2013 |
| JP | 2014175546 A | 9/2014 |
| TW | 200628029 A | 8/2006 |
| TW | 201205701 A | 2/2012 |
| TW | 201503314 A | 1/2015 |

OTHER PUBLICATIONS

Taiwan Office Action dated Oct. 25, 2016, filed in Taiwan counterpart Application No. 10516352, 6 pages (with translation).
Japanese Office Action dated Apr. 20, 2018, filed in Japanese counterpart Application No. 2015-177402, 9 pages (with translation).

* cited by examiner

METHOD AND APPARATUS FOR MANUFACTURING A SEMICONDUCTOR DEVICE INCLUDING A PLURALITY OF SEMICONDUCTOR CHIPS CONNECTED WITH BUMPS

CROSS-REFERENCE TO RELATED APPLICATION

This application is based upon and claims the benefit of priority from Japanese Patent Application No. 2015-177482, filed Sep. 9, 2015, the entire contents of which are incorporated herein by reference.

FIELD

Embodiments described herein relate generally to a method and an apparatus for manufacturing a semiconductor device, in particular, a semiconductor device including a plurality of semiconductor chips connected with bumps.

BACKGROUND

In a semiconductor device of one type, a plurality of semiconductor chips is stacked in order to reduce a mounting area. In some cases, a micro-bump is used for connection between the semiconductor chips.

DETAILED DESCRIPTION

On or more embodiments provide a method for manufacturing a semiconductor device and a mounting device in that can improve reliability of connection between stacked semiconductor chips.

According to one embodiment, a method for manufacturing a semiconductor device including a plurality of semiconductor chips includes steps of placing, on a first semiconductor chip, a second semiconductor chip, such that a plurality of bumps is located between the first semiconductor chip and the second semiconductor chip, determining a distance between the first semiconductor chip and the second semiconductor chip, and determining whether or not the distance is within a predetermined range and stopping placement of additional chips if the distance is determined to be outside the predetermined range.

Hereinafter, a method for manufacturing a semiconductor device and a mounting device according to embodiments will be described in detail with reference to the accompanying drawings. However, a scope of the present disclosure is not limited to the embodiments.

(First Embodiment)

Figure 1:
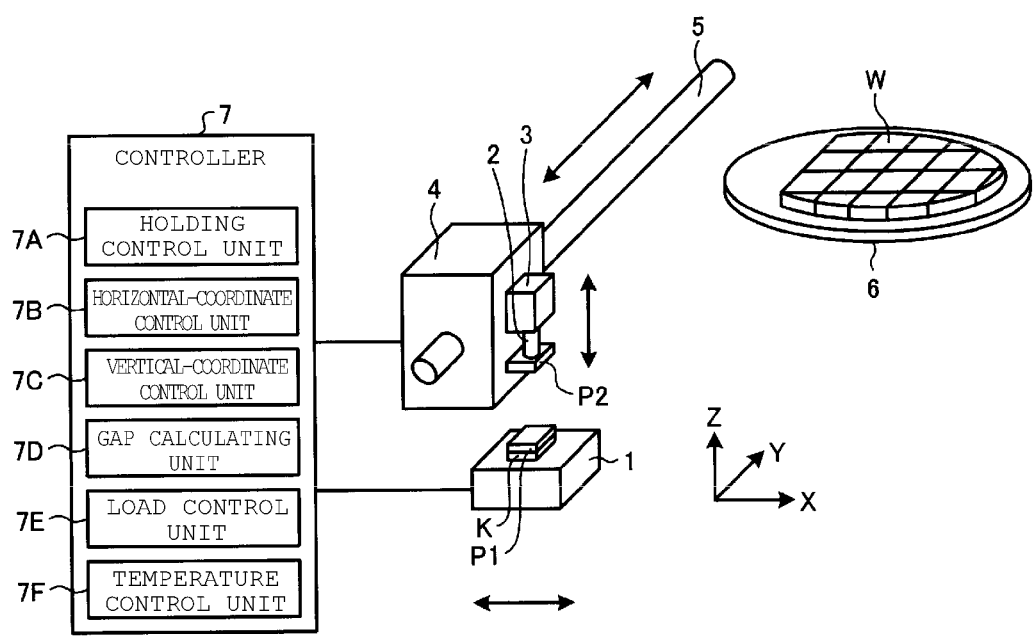
FIG. 1 illustrates a schematic configuration of a mounting device according to a first embodiment.

FIG. 1 illustrates a schematic configuration of a mounting device according to a first embodiment. In FIG. 1, the mounting device includes a bonding stage 1, a bonding head 2, a vertically-movable body 3, a horizontally-movable body 4, a wafer stage 6, and a controller 7. In FIG. 1, a substrate K and a semiconductor chip P1 are positioned over the bonding stage 1. Further, a semiconductor chip P2 is being stacked on the semiconductor chip P1. The bonding stage 1 can move in the horizontal direction (X-axis direction and Y-axis direction as necessary). The bonding head 2 picks up the semiconductor chips P1 and P2. The vertically-movable body 3 causes the bonding head 2 to move in the vertical direction (Z-axis direction). The vertically-movable body 3 is supported by the horizontally-movable body 4. The horizontally-movable body 4 can move between a position above the bonding stage 1 and a position above the wafer stage 6 in the horizontal direction (Y-axis direction). The horizontally-movable body 4 is supported by a guide 5 so as to be movable in the horizontal direction above the bonding stage 1 and the bonding head 2. The wafer stage 6 holds a wafer W. At this time, the wafer W is diced into pieces including the semiconductor chips P1 and P2, in advance.

The controller 7 includes a holding control unit 7A, a horizontal-coordinate control unit 7B, a vertical-coordinate control unit 7C, a gap calculating unit 7D, a load control unit 7E, and a temperature control unit 7F. The holding control unit 7A controls the picking-up of the semiconductor chips P1 and P2 by the bonding head 2. The horizontal-coordinate control unit 7B controls horizontal positions of the bonding stage 1 and the horizontally-movable body 4. The vertical-coordinate control unit 7C controls a vertical coordinate of the bonding head 2. The gap calculating unit 7D calculates a gap between the semiconductor chips P1 and P2 in the vertical direction, based on the vertical coordinates (Z-coordinates) of the bonding head 2 that is obtained when the semiconductor chips P1 and P2 are stacked. To measure the Z-coordinate of the bonding head 2, for example, if the vertically-movable body 3 is caused to move in the Z-axis direction by using a ball screw and a motor, it is possible to use a rotary encoder that measures a rotational angle of the motor. Then, the rotational angle measured by the rotary encoder is converted into the amount of the movement of the bonding head 2 in the Z-axial direction. Alternatively, if a linear guide and a linear motor are used to cause the vertically-movable body 3 to move in the Z-axis direction, for example, a laser displacement sensor or the like may be fixed and attached to the horizontally-movable body 4 and the Z-coordinate of the bonding head 2 can be measured using a laser beam that is emitted from the laser displacement sensor and reflected by the top surface of the vertically-movable body 3.

The load control unit 7E controls a load applied to the semiconductor chips P1 and P2 when the semiconductor chips P1 and P2 are stacked. The bonding head 2 may have a load sensor that measures the load applied to the semiconductor chips P1 and P2. The temperature control unit 7F controls temperatures of the semiconductor chips P1 and P2 when the semiconductor chips P1 and P2 are stacked. The bonding stage 1 and the bonding head 2 may have heaters that heat the bonding stage 1 and the bonding head 2, respectively. In addition, the bonding stage 1 and the bonding head 2 may have temperature sensors that measure the temperatures of the bonding stage 1 and the bonding head 2, respectively.

(Second Embodiment)

Figure 2A:
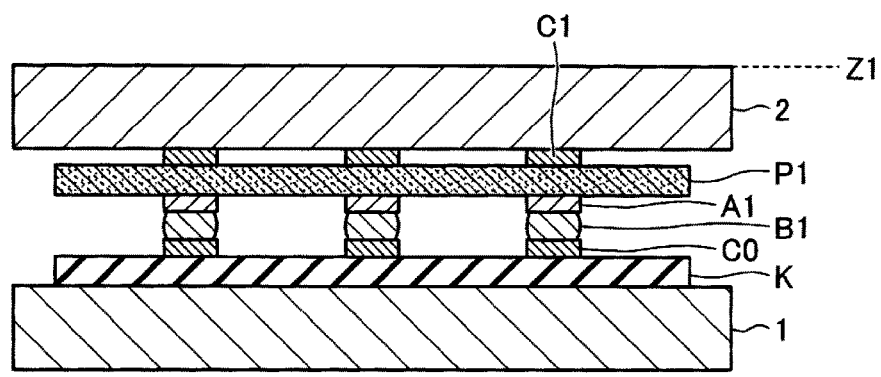
FIGS. 2A to 2C are cross-sectional views of one or more semiconductor chips for illustrating a method for manufacturing a semiconductor device according to a second embodiment.
Figure 2B:
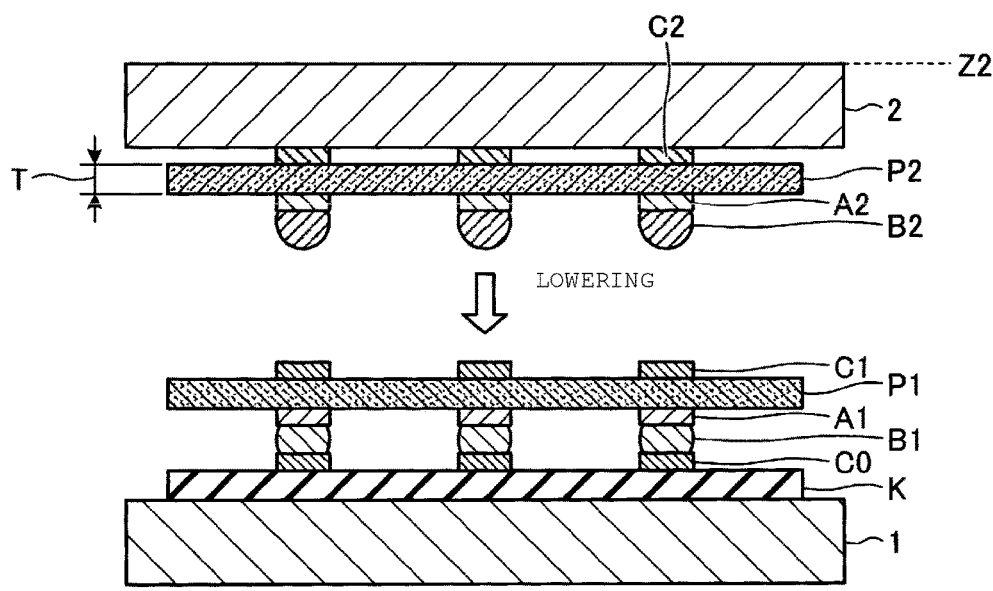
Figure 2C:
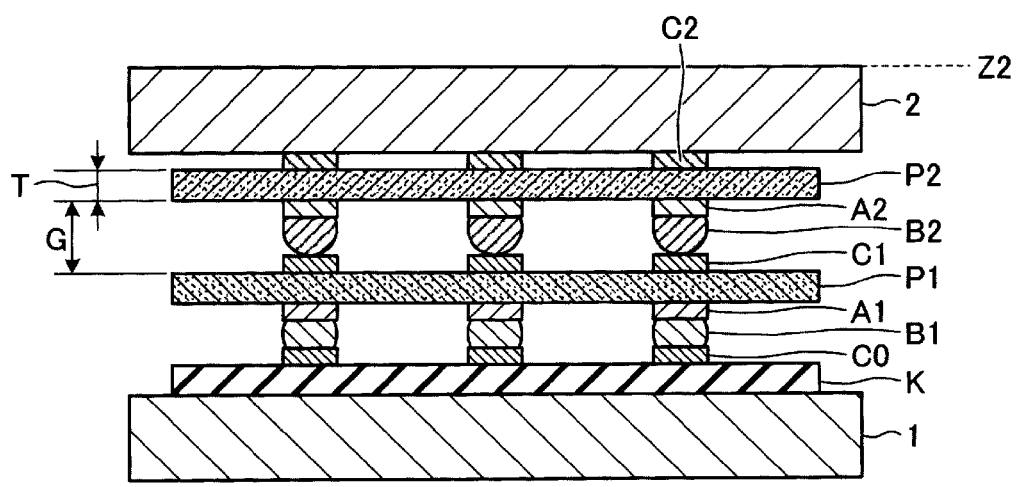

FIGS. 2A to 2C are cross-sectional views of one or more semiconductor chips for illustrating a method for manufacturing a semiconductor device according to a second embodiment.

In FIGS. 2A to 2C, a front-surface electrode C0 is provided on a substrate K. A plurality of rear-surface electrodes A1 is provided on a rear surface of the semiconductor chip P1, and a plurality of front-surface electrodes C1 is provided on a front surface of the semiconductor chip P1. A plurality of bump electrodes B1 is provided on the rear-surface electrode A1. A plurality of rear-surface electrodes A2 is provided on a rear surface of the semiconductor chip P2, and a plurality of front-surface electrodes C2 is provided on a front surface side of the semiconductor chip P2. A plurality of bump electrodes B2 is provided on the rear-surface electrode A2. A pitch between the bump electrodes B1 and B2 can be set as about 10 µm to 100 µm. The diameters of the bump electrodes B1 and B2 can be set as about 5 µm to 50 µm. For example, as the substrate K, a multi-layer printed wiring board can be used. Electrical components including transistors are formed in each of the semiconductor chips P1 and P2. The electrical components may be a NAND flash memory, a logic circuit, or a processor. For example, as a base material of the substrate K, it is possible to use a bismaleimide triazine (BT) resin or the like. As a material of the front-surface electrode C0, it is possible to use Cu or the like. Au coating may be formed in a portion of each front-surface electrode C0 that is exposed through solder resist. Materials of the rear-surface electrodes A1 and A2 and the front-surface electrodes C1 and C2 may be a single-layer film or a stacked film made of Au, Cu, Ni, Sn, Pg, Ag, or the like. As a material of the bump electrodes B1 and B2, it is possible to use a solder material or the like.

For example, as materials of the front-surface electrodes C1 and C2 and the rear-surface electrodes A1 and A2, it is possible to use Ni. Here, a barrier metal film containing Ti maybe formed under Ni. Au coating may be formed on the barrier metal film. As a material of the bump electrodes B2, it is possible to use Sn. A foundation layer made of Cu may be formed under each of the bump electrodes B2.

As illustrated in FIG. 2A, the substrate K is positioned on the bonding stage 1. Then, the horizontally-movable body 4 moves to and stops at a position above the wafer stage 6, the vertically-movable body 3 is lowered, and the bonding head 2 comes into contact with the semiconductor chip P1 on the wafer stage 6. Then, after the semiconductor chip P1 is picked up by the bonding head 2, the horizontally-movable body 4 moves to and stops at a position above the bonding stage 1. Then, after the bonding stage 1 moves in the horizontal direction, alignment of X- and Y-coordinates of the semiconductor chip P1 and the substrate K is performed. Then, the vertically-movable body 3 is lowered, and the semiconductor chip P1 is positioned on the substrate K. Then, the semiconductor chip P1 is heated in a state in which a load is applied to the semiconductor chip P1 through the bonding head 2. At this time, the bump electrodes B1 melt and are bonded to the front-surface electrodes C0. Then, the semiconductor chip P1 is cooled through the bonding head 2 and the bump electrodes B1 are solidified. Then, the bonding head 2 is lifted, and separated from the semiconductor chip P1. During this process, a Z-coordinate Z1 of the bonding head 2 is measured and is stored in the controller 7 when the bump electrodes B1 and the front-surface electrodes C0 are bonded. The Z-coordinate Z1 may be measured when the bump electrodes B1 melt or when the bump electrodes B1 are solidified after melting.

Then, the horizontally-movable body 4 moves to and stops at a position above the wafer stage 6, the vertically-movable body 3 is lowered, and the bonding head 2 comes into contact with the semiconductor chip P2. Then, after the semiconductor chip P2 is picked up by the bonding head 2, the horizontally-movable body 4 moves to and stops at a position above the bonding stage 1. Then, after the bonding stage 1 moves in the horizontal direction, alignment of X- and Y-coordinates of the semiconductor chips P1 and P2 is performed. Then, the vertically-movable body 3 is lowered as illustrated in FIG. 2B, and the semiconductor chip P2 is positioned on the semiconductor chip P1, as illustrated in FIG. 2C. Then, the semiconductor chip P2 is heated in a state in which a load is applied to the semiconductor chip P2 through the bonding head 2. At this time, the bump electrodes B2 melt and are bonded to the front-surface electrodes C1. For example, when Sn is used for the bump electrodes B2 and Ni is used for the front-surface electrodes C1, and Ni—Sn alloy is formed when the bump electrodes B2 and the front-surface electrodes C1 are bonded. Then, the semiconductor chip P2 is cooled through the bonding head 2 and the bump electrodes B2 are solidified. Then, the bonding head 2 is lifted and separated from the semiconductor chip P2. During this process, a Z-coordinate Z2 of the bonding head 2 is measured and stored in the controller 7 when the bump electrodes B2 and the front-surface electrodes C1 are bonded. The Z-coordinate Z2 may be measured when the bump electrode B2 melts or when the bump electrode B2 is solidified after melting. At this time, the controller 7 acquires data of a chip thickness T of the semiconductor chip P2. The data maybe design data or process data obtained during manufacture of the semiconductor chip P2. For example, the process data may be chip thickness data of the wafer W that have been obtained when the wafer W was thinned through a chemical-mechanical polishing (CMP).

Then, a gap G between the semiconductor chips P1 and P2 in the Z-axis direction is calculated by the gap calculating unit 7D, based on the Z-coordinates Z1 and Z2 of the bonding head 2 and the chip thickness T of the semiconductor chip P2. Here, the relationship of $G=Z2-Z1-T$ is satisfied. Then, it is determined whether or not the gap G is formed within a standard range, and, when the gap G is determined to be out of the standard range, the mounting device in FIG. 1 is stopped with an alarm. Since a difference between the Z-coordinates Z1 and Z2 is used in the calculation of the gap G, it is not important where the origin of the Z-coordinates is set. In addition, the Z-coordinates Z1 and Z2 of the bonding head 2 may be measured through measurement of any portion, as long as the portion moves along with the bonding head 2 in the Z-axis direction. For example, the Z-coordinate of the bonding head 2 may be measured or the Z-coordinate of the vertically-movable body 3 may be measured for the measurement of the Z-coordinates Z1 and Z2 of the bonding head 2.

Here, when the semiconductor chip P2 is mounted on the semiconductor chip P1, based on the gap G between the semiconductor chips P1 and P2, it is possible to determine a contact state of the bump electrodes B2 and remove a semiconductor device suffering contact failure of the bump electrodes B2. Here, the gap G between the semiconductor chips P1 and P2 is changed depending on variations in composition of the bump electrodes B2, variation in size of the bump electrodes B2, or the load applied to the semiconductor chip P2. For example, when the variation in size of the bump electrodes B2 is significant, the gap G between the semiconductor chips P1 and P2 increases and contact failure of the bump electrode B2 is more likely to occur. As the load applied to the semiconductor chip P2 decreases, the gap G between the semiconductor chips P1 and P2 increases and contact failure of the bump electrode B2 is more likely to occur. As the load applied to the semiconductor chip P2 increases, the gap G between the semiconductor chips P1 and P2 decreases and short is more likely to occur between the adjacent bump electrodes B2. As the variation in composition of the bump electrode B2 are significant, variations in melting points of the bump electrode B2 tend to be significant and variation in the gap G between the semiconductor chips P1 and P2 also tends to be significant . For this reason, short may occur between the adjacent bump electrodes B2 at which the gap G is excessively small. Hence, when the gap G is out of the standard range, the mounting device in FIG. 1 is stopped with an alarm, thereby making it possible to remove a semiconductor device suffering mounting failure of the semiconductor chip P2.

For example, it is possible to use the semiconductor chips P1 and P2 stacked on the substrate K as a system in package (SiP). In order to electrically connect between the semiconductor chips P1 and P2, penetration electrodes may be formed in the semiconductor chips P1 and P2, respectively, or a bonding wire may be used alternatively.

Figure 3:
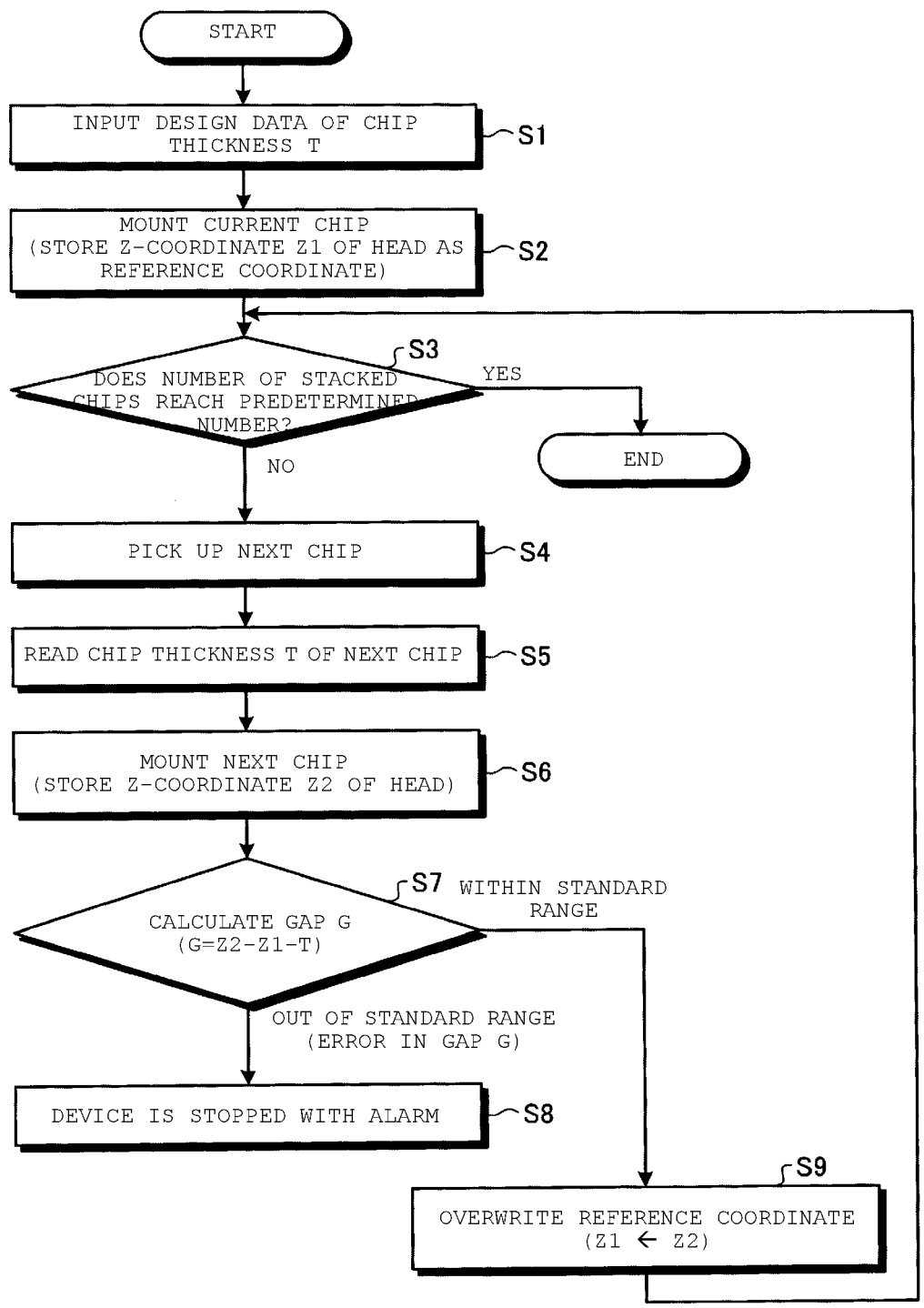
FIG. 3 is a flowchart of the method for manufacturing the semiconductor device according to the second embodiment.

FIG. 3 is a flowchart of a method for manufacturing the semiconductor device according to the second embodiment.

In FIG. 3, design data of the chip thickness T of the semiconductor chips is input in advance (S1). Then, a current semiconductor chip picked up by the bonding head 2 is mounted on a substrate K (S2). At this time, the Z-coordinate Z1 of the bonding head 2 is stored as a reference coordinate. Then, the number of stacked semiconductor chip(s) is checked (S3), and when the number of the stacked chip (s) is the predetermined number (Yes in S3), the mounting ends. When the number of stacked chip(s) is less than the predetermined number (No in S3), the next semiconductor chip is picked up by the bonding head 2 (S4) and the design data of the chip thickness T of the semiconductor chip is introduced into the gap calculating unit 7D (S5). Then, the upper semiconductor chip picked up by the bonding head 2 is mounted on the lower semiconductor chip (S6). At this time, the Z-coordinate Z2 of the bonding head 2 is stored. Then, the gap G between the top two stacked semiconductor chips is calculated, based on the Z-coordinates Z1 and Z2 of the bonding head 2 and the chip thickness T of the semiconductor chip (S7) . At this time, when the gap G is determined to be out of the standard range, the mounting device in FIG. 1 is stopped with an alarm (S8) . On the other hand, when the gap G is determined to be within the standard range, the reference coordinate is overwritten from Z1 to Z2 (S9) and the process returns to S3. Then, until the number of stacked semiconductor chips reaches the predetermined number, the process from S3 to S9 is repeated.

Figure 4:
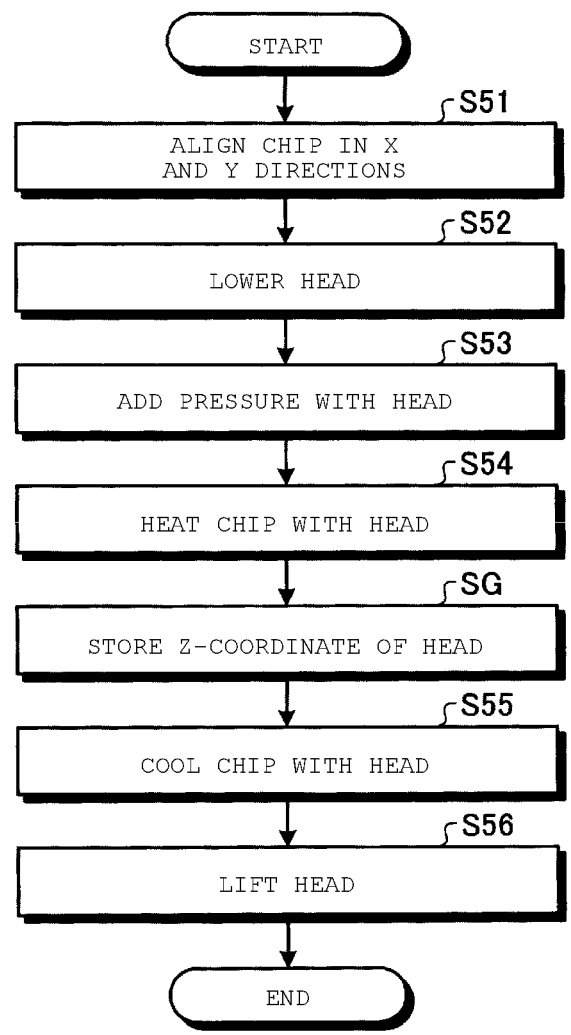
FIG. 4 is a flowchart of a method for mounting semiconductor chips according to the second embodiment.

FIG. 4 is a flowchart of a method for mounting semiconductor chips according to the second embodiment. The mounting process in FIG. 4 may be used in S2 and S6 in FIG. 3.

In FIG. 4, when the semiconductor chip picked up by the bonding head 2 moves to and stops at a position above the bonding stage 1, alignment of the X- and Y-coordinates of the semiconductor chip is performed (S51). Then, the bonding head 2 is lowered (S52), and the upper semiconductor chip is placed on the lower semiconductor chip. Then, the semiconductor chip is heated in a state in which a load is applied to the semiconductor chip through the bonding head 2 (S53 and S54). Through these steps, the upper semiconductor chip is bonded to the lower semiconductor chip through the bump electrodes. At this time, the Z-coordinate of the bonding head 2 may be recorded. Then, the semiconductor chip is cooled through the bonding head 2, and the bump electrodes are solidified (S55). Here, instead of recording the Z-coordinate of the bonding head 2 when the bump electrodes melt, the Z-coordinate of the bonding head 2 when the bump electrodes are solidified may be recorded. Then, the bonding head 2 is lifted, and the bonding head 2 is separated from the upper semiconductor chip (S56).

(Third Embodiment)

Figure 5:
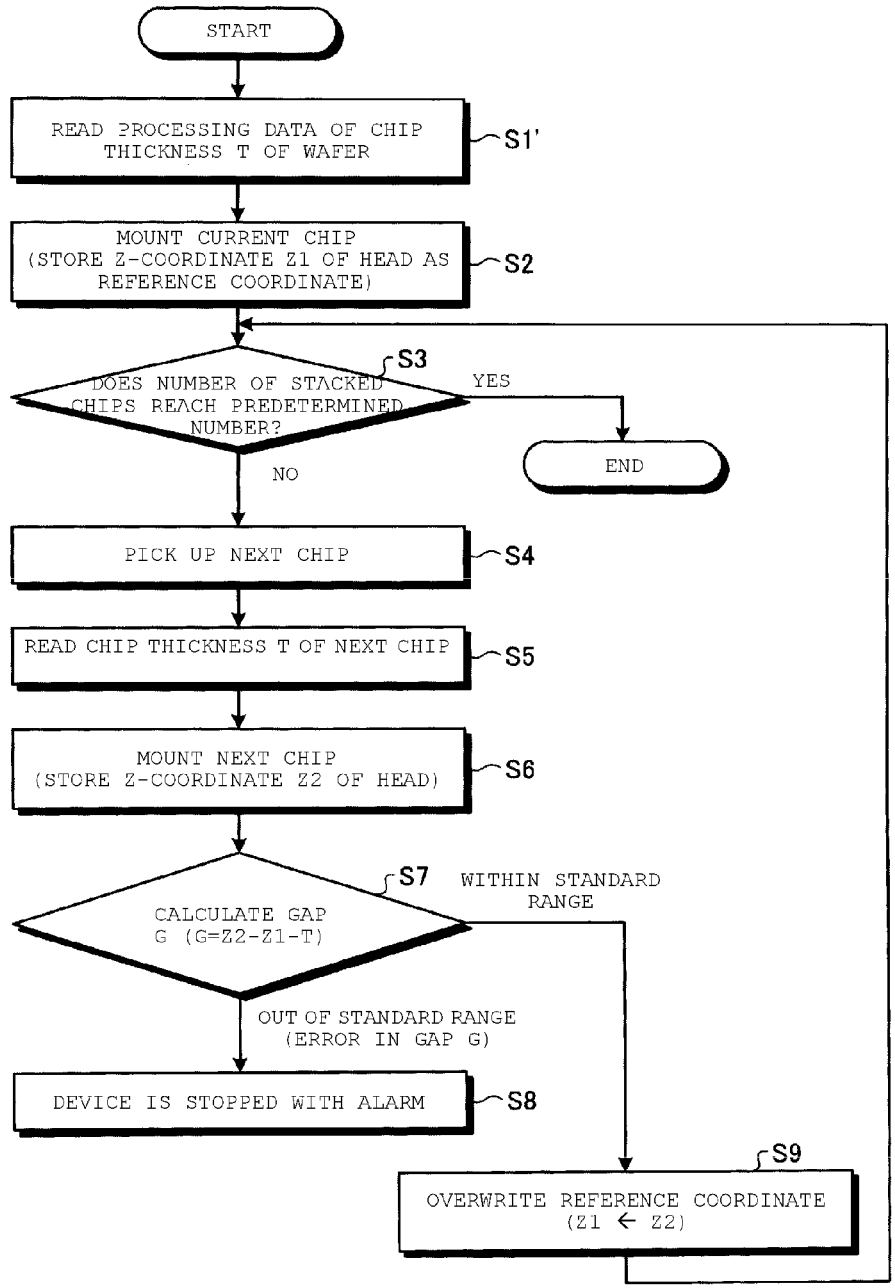
FIG. 5 is a flowchart of a method for manufacturing a semiconductor device according to a third embodiment.

FIG. 5 is a flowchart of a method for manufacturing a semiconductor device according to a third embodiment.

In the flowchart in FIG. 5, S1' is performed instead of S1 in FIG. 3. The flowchart is the same as that in FIG. 3 except for S1'. In S1, the design data of the chip thickness T is input; however, in S1', process data of the chip thickness T of the wafer W is input. Then, instead of the design data, the process data of the chip thickness T is used for the calculation of the gap G in S7. In this manner, an error in the chip thickness T due to manufacturing variations during wafer processing can be reflected in the calculation of the gap G, and it is possible to improve calculation accuracy of the gap G.

(Fourth Embodiment)

Figure 6A:
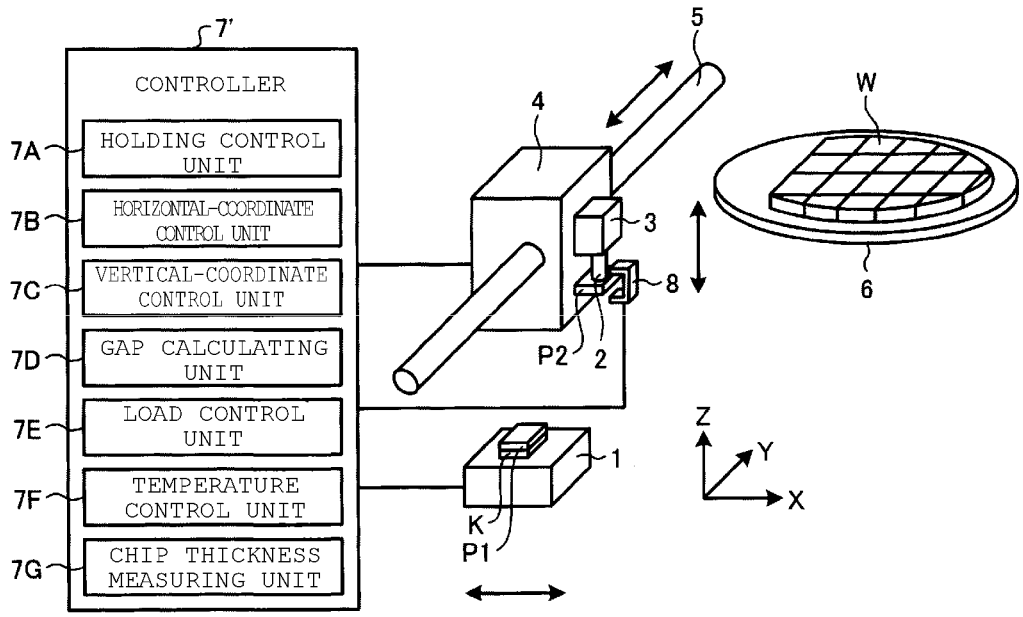
FIGS. 6A and 6B illustrate a schematic configuration of a mounting device according to a fourth embodiment.
Figure 6B:
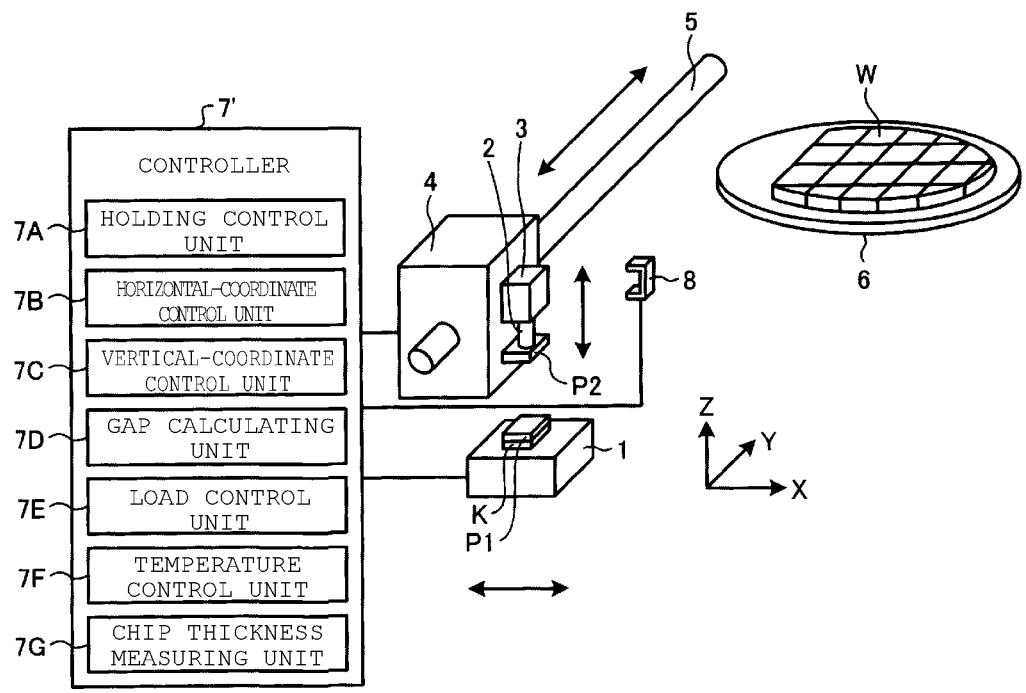

FIGS. 6A and 6B illustrate a schematic configuration of a mounting device according to a fourth embodiment.

The mounting device in FIGS. 6A and 6B includes a controller 7' instead of the controller 7 in FIG. 1. The controller 7' further includes a chip thickness measuring unit 7G, in addition to the units included in the controller 7. The chip thickness measuring unit 7G performs measurement control of the chip thickness T by a laser displacement sensor 8. In addition, the mounting device illustrated in FIGS. 6A and 6B further includes the laser displacement sensor 8, in addition to the components included in the mounting device in FIG. 1. The laser displacement sensor 8 irradiates the semiconductor chip P2 with laser from above and below the semiconductor chip P2, thereby making it possible to measure the chip thickness T of the semiconductor chip P2.

Then, as illustrated in FIG. 6A, after the semiconductor chip P1 is stacked over the substrate K, the semiconductor chip P2 is picked up by the bonding head 2. Then, the semiconductor chip P2 is placed between two portions of the laser displacement sensor 8 and is irradiated with laser from above and below the semiconductor chip P2, and the chip thickness T of the semiconductor chip P2 is measured. Then, as illustrated in FIG. 6B, the semiconductor chip P2 picked up by the bonding head 2 moves to and stops at a position above the bonding stage 1. Then, after the alignment of the X- and Y-coordinates between the semiconductors P1 and P2 is performed, the semiconductor chip P2 is stacked on the semiconductor chip P1. Here, the Z-coordinate Z1 of the bonding head 2 is stored, when the semiconductor chip P1 is stacked on the substrate K. Similarly, the Z-coordinate Z2 of the bonding head 2 is stored when the semiconductor chip P2 is stacked on the semiconductor chip P1. Then, the gap G between the semiconductor chips P1 and P2 is calculated by the gap calculating unit 7D, based on the Z-coordinates Z1 and Z2 of the bonding head 2 and the measurement data of the chip thickness T of the semiconductor chip P2.

According to the present embodiment, the measurement data of the chip thickness T is used in the calculation of the gap G, thereby making it possible to reflect variations in the chip thickness T between the semiconductor chips P1 and P2 and making it possible to improve calculation accuracy of the gap G.

(Fifth Embodiment)

Figure 7:
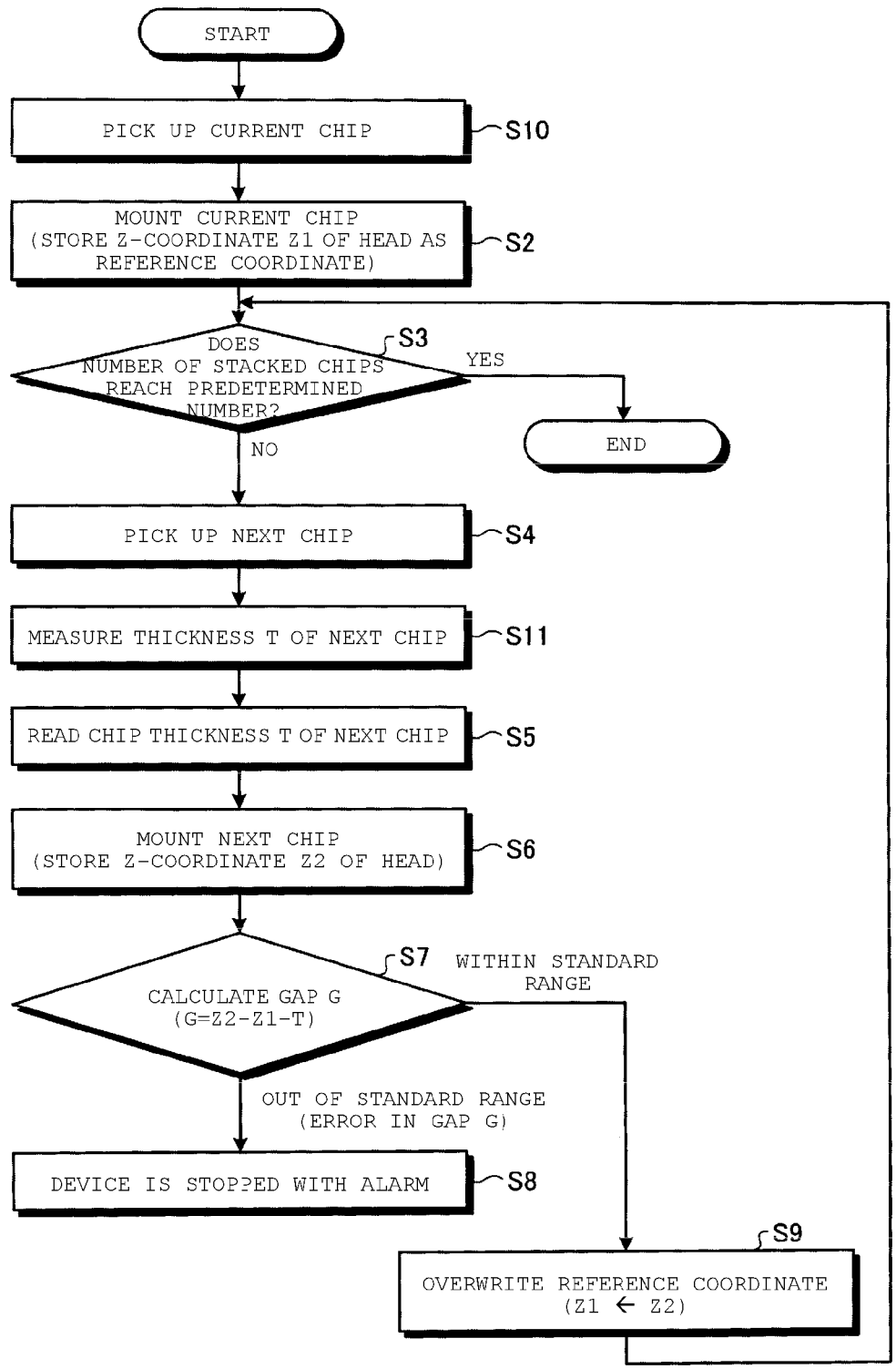
FIG. 7 is a flowchart of a method for manufacturing a semiconductor device according to a fifth embodiment.

FIG. 7 is a flowchart of a method for manufacturing a semiconductor device according to a fifth embodiment.

In the flowchart in FIGS. 7, S10 and S11 are performed instead of S1 in FIG. 3. The flowchart is the same as that in FIG. 3 except for S10 and S11. In S10, a (first) semiconductor chip is picked up by the bonding head 2, and the semiconductor chip is mounted on a substrate K. In S11, after the next semiconductor chip is picked up by the bonding head 2, the chip thickness T of the (nest) semiconductor chip is measured using a measurement device, such as the laser displacement sensor 8 shown in FIGS. 6A and 6B. Then, instead of design data, the measurement data of the chip thickness T is used in the calculation of the gap G in S7.

(Sixth Embodiment)

Figure 8A:
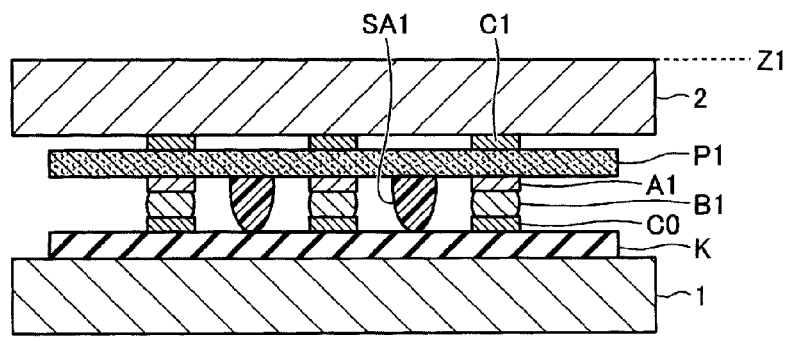
FIGS. 8A to 8C are cross-sectional views of one or more semiconductor chips for illustrating a method for manufacturing a semiconductor device according to a sixth embodiment.
Figure 8B:
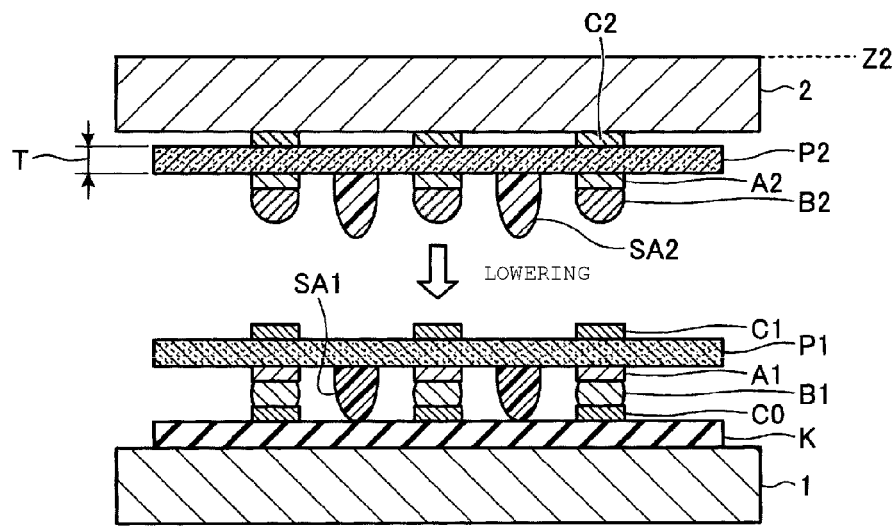
Figure 8C:
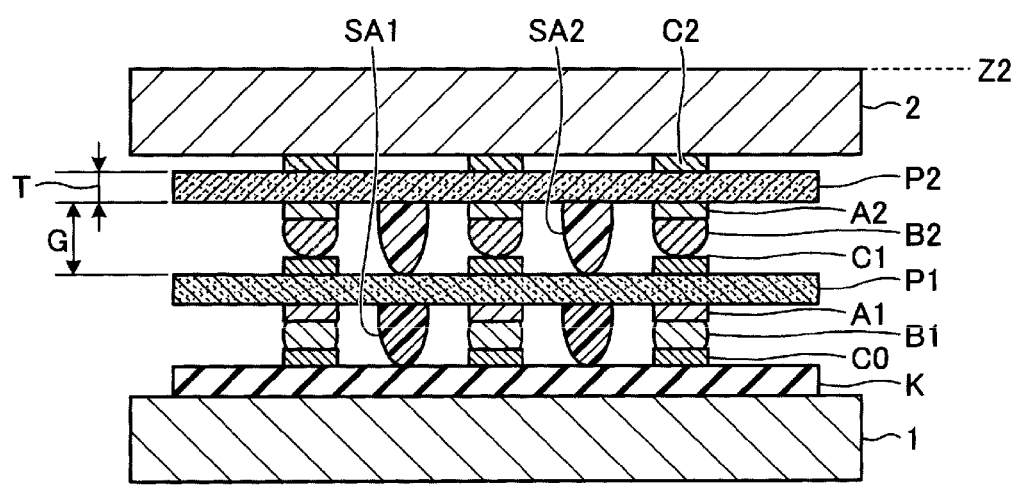

FIGS. 8A to 8C are cross-sectional views of one or more semiconductor chips for illustrating a method for manufacturing a semiconductor device according to a sixth embodiment.

In a configuration shown in FIGS. 8A to 8C, spacers SA1 and SA2 are further formed on the semiconductor chips P1 and P2, respectively. The spacer SA1 is used to secure a gap between the substrate K and the semiconductor chip P1. The spacer SA2 is used to secure a gap between the semiconductor chips P1 and P2. As materials of the spacers SA1 and SA2, it is possible to use an insulating resin having an adhesive property below the melting temperature of the bump electrodes B1 and B2. For example, as the material of the spacers SA1 and SA2, it is possible to use an epoxy resin, a polyimide resin, an acrylic resin, a phenol resin, a benzocyclobutene resin, or the like.

As illustrated in FIG. 8A, the semiconductor chip P1 picked up by the bonding head 2 is stacked on the substrate K. At this time, the semiconductor chip P1 adheres to the substrate K with the spacer SA1. In addition, the Z-coordinate Z1 of the bonding head 2 is stored. At this time, the bump electrodes B1 are caused to not melt such that an unbonded state between the bump electrodes B1 and the front-surface electrodes C0 is maintained.

Then, as illustrated in FIG. 8B, the semiconductor chip P2 is picked up by the bonding head 2. Then, the bonding head is lowered towards the semiconductor chip P1 and the semiconductor chip P2 is stacked on the semiconductor chip P1 as illustrated in FIG. 8C. In addition, the Z-coordinate Z2 of the bonding head 2 is stored. At this time, the bump electrodes B2 are caused to not melt such that an unbonded state between the bump electrodes B1 and B2 is maintained.

Then, the gap G between the semiconductor chips P1 and P2 is calculated based on the Z-coordinates Z1 and Z2 of the bonding head 2 and the chip thickness T of the semiconductor chip P2. Then, if gap G is determined to be within the standard range, the mounting device continues operating, and, if the gap G is determined to be out of the standard range, the mounting device is stopped with an alarm. When the number of stacked semiconductor chips P1 and P2 reaches the predetermined number, the bump electrodes B1 and B2 of the semiconductor chips P1 and P2 collectively melt, and the respective bump electrodes B1 and B2 are bonded.

Here, the spacers SA1 and SA2 are provided on the semiconductor chips P1 and P2, thereby making it possible for the semiconductor chips P1 and P2 to adhere without melting the respective bump electrodes B1 and B2. As there is no need to perform reflow soldering every time a semiconductor chip is stacked, there is no need to repeat raising and lowering the temperature of the semiconductor chip every time a semiconductor chip is stacked. Therefore, it is possible to improve throughput and it is possible to reduce thermal stress applied to the semiconductor chips P1 and P2.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein maybe made without departing from the spirit of the inventions. The accompanying claims and their equivalents are intended to cover such forms or modifications as would fall within the scope and spirit of the inventions.

What is claimed is:

1. A method for manufacturing a semiconductor device including a plurality of semiconductor chips, the method comprising:

placing, on a first semiconductor chip, a second semiconductor chip, such that a plurality of bumps is located between the first semiconductor chip and the second semiconductor chip;

after said placing, softening and then solidifying the plurality of bumps to bond the first semiconductor chip and the second semiconductor chip to each other;

measuring a position of a head for holding a semiconductor chip to be placed at least one of when the plurality of bumps is softened and when the plurality of bumps is solidified, while the head holds the second semiconductor chip;

determining a distance between the first semiconductor chip and the second semiconductor chip placed thereon, based on a position of the head when the first semiconductor chip is placed on a substrate by the head, the measured position of the head, and a thickness of the second semiconductor chip; and determining whether or not the distance is within a predetermined range and stopping placement of additional chips if the distance is determined to be outside the predetermined range.

2. The method according to claim 1, further comprising:
when the distance is determined to be within the predetermined range, placing, on the second semiconductor chip, a third semiconductor chip, such that a plurality of bumps is located between the second semiconductor chip and the third semiconductor chip.

3. The method according to claim 2, further comprising:
when the distance is determined to be outside the predetermined range, generating an alert.

4. The method according to claim 1, further comprising:
measuring the thickness of the second semiconductor chip before the second semiconductor chip is placed on the first semiconductor chip.

5. The method according to claim 1, wherein
the thickness of the second semiconductor chip is stored in a storage device, and the stored thickness is retrieved for the determination of the distance.

6. A method for manufacturing a semiconductor device including a plurality of semiconductor chips, the method comprising:

placing, on a first semiconductor chip, a second semiconductor chip, such that a first plurality of bumps is located between the first semiconductor chip and the second semiconductor chip;

after said placing, measuring a position of a head for holding a semiconductor chip to be placed, when the head holds the second semiconductor chip placed on the first semiconductor chip;

determining a first distance between the first semiconductor chip and the second semiconductor chip placed thereon, based on a position of the head when the first semiconductor chip is placed on a substrate by the head, the measured position of the head, and a thickness of the second semiconductor chip;

determining whether or not the first distance is within a predetermined range;

when the first distance is determined to be within the predetermined range, placing, on the second semiconductor chip, a third semiconductor chip, such that a second plurality of bumps is located between the second semiconductor chip and the third semiconductor chip;

determining whether or not a second distance between the second semiconductor chip and the third semiconductor chip is within the predetermined range; and when the second distance is determined to be within the predetermined range, softening and then solidifying both of the first and second plurality of bumps at once.

7. The method according to claim 6, further comprising:
measuring the thickness of the second semiconductor chip before the second semiconductor chip is placed on the first semiconductor chip.

8. The method according to claim 6, wherein
the thickness of the second semiconductor chip is stored in a storage device, and the stored thickness is retrieved for the determination of the first distance.

9. The method according to claim 6, further comprising:
after the third semiconductor chip is placed on the second semiconductor chip, measuring the position of the head when the head holds the third semiconductor chip placed on the second semiconductor chip; and determining the second distance based on the measured position of the head when the head holds the second semiconductor chip placed on the first semiconductor chip, the measured position of the head when the head holds the third semiconductor chip placed on the second semiconductor chip, and a thickness of the third semiconductor chip.

* * * * *